United States Patent
Bänisch et al.

(10) Patent No.: US 6,515,374 B1
(45) Date of Patent: Feb. 4, 2003

(54) CONTACT CONNECTION OF METAL INTERCONNECTS OF AN INTEGRATED SEMICONDUCTOR CHIP

(75) Inventors: Andreas Bänisch, München (DE); Sabine Kling, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/633,704

(22) Filed: Aug. 7, 2000

(30) Foreign Application Priority Data

Aug. 5, 1999 (DE) .......................... 199 36 862

(51) Int. Cl.[7] .......................................... H01L 27/108
(52) U.S. Cl. ...................... 257/907; 257/908; 257/909
(58) Field of Search ................................. 438/618, 622, 438/128, 598; 257/758, 748, 907, 906, 211, 908, 296; 365/185.12, 51

(56) References Cited

U.S. PATENT DOCUMENTS

| | | | |
|---|---|---|---|
| 4,710,789 A | * 12/1987 | Furutani et al. | 365/149 |
| 4,922,453 A | * 5/1990 | Hidaka | 365/190 |
| 5,170,243 A | * 12/1992 | Dhong et al. | 257/304 |
| 5,332,923 A | * 7/1994 | Takeuchi | 257/296 |
| 5,506,450 A | * 4/1996 | Lee et al. | 257/767 |
| 5,612,252 A | * 3/1997 | Lur et al. | 437/187 |
| 5,838,036 A | * 11/1998 | Mori | 257/296 |

* cited by examiner

*Primary Examiner*—Phat X. Cao
*Assistant Examiner*—Thao X. Le
(74) *Attorney, Agent, or Firm*—Laurence A. Greenberg; Werner H. Stemer; Ralph E. Locher

(57) ABSTRACT

An integrated semiconductor chip has at least two metal interconnects of two different metallization planes, which are disposed parallel to one another. The metal interconnects are connected to one another via at least one electrically conductive contact point. The metal interconnects, for each direction, run orthogonally with respect to one another in a first region. For each direction, they run parallel to one another and at an oblique angle to the directions of the metal interconnects of the first region in a second region (20), in which they are contact-connected to one another. This configuration makes it possible, with little influence of electromigration, to have a comparatively small space requirement needed for the contact connection of mutually orthogonal interconnects.

6 Claims, 2 Drawing Sheets

CONTACT CONNECTION OF METAL INTERCONNECTS OF AN INTEGRATED SEMICONDUCTOR CHIP

BACKGROUND OF THE INVENTION

Field of the Invention

The present invention relates to a contact connection of metal interconnects of an integrated semiconductor chip which are disposed orthogonally with respect to one another in different metallization planes.

The structure of an integrated semiconductor chip generally exhibits a plurality of metallization planes that are parallel to one another. The various metallization planes each contain metal interconnects for electrically connecting different circuit sections of the integrated circuit. The metal interconnects of two different metallization planes are connected to one another via contact points which establish an electrically conductive connection between the metal interconnects.

Layout structures of an integrated semiconductor chip are usually aligned in wide regions according to an orthogonal grid. Therefore, for example, the metal interconnects of different metallization planes run parallel or at a right angle to one another. The layout of an integrated semiconductor chip is in this case generally oriented to a right-angled coordinate system with which the various manufacturing processes in the course of fabricating a semiconductor module are usually coordinated. As a consequence thereof, structures which are aligned according to an orthogonal grid can generally be manufactured faster and more precisely. For example, structures that are diagonal relative thereto can only be approximated in a step-like manner, which may require a corresponding data density and, in individual cases, a longer fabrication time.

If two mutually orthogonal metal interconnects of two different metallization planes are contact-connected to one another, use is usually made, primarily for the reasons mentioned above, of contacts whose areas fit into the orthogonal grid. For example, if the contact area of a contact is wider than one of the metal interconnects or contact connection is to be effected via a plurality of contacts along the metal interconnects, then it is necessary that the metal interconnects that are to be contact-connected run parallel to one another in a section corresponding to the length of the contact point to be provided. To ensure that at the contact points the material nature of the metal interconnects is influenced as little as possible by electromigration, it is the case, moreover, that as far as possible no right-angled changes in the direction of the metal interconnects should be provided.

Customary concepts hitherto for contact connection provide mutually orthogonal metal interconnects which, for the purpose of contact connection, approximate to a parallel course in a step-like manner, for example, resulting in a relatively high space requirement on the chip area. Other concepts for contact connection provide contact connection at other more suitable locations, but this usually results in additional complexity in the layout configuration process.

SUMMARY OF THE INVENTION

The object of the present invention is to specify a semiconductor chip having at least two mutually orthogonal metal interconnects of two different metallization planes which are contact-connected to one another in such a way that the requisite space requirement is as small as possible and the influence of electromigration is reduced as much as possible.

With the foregoing and other objects in view there is provided, in accordance with the invention, an integrated semiconductor chip. The semiconductor chip contains metal interconnects having a first region and a second region and, including, at least one first metal interconnect of a first metallization plane and a second metal interconnect of a second metallization plane running parallel to the first metallization plane. At least one electrically conductive contact point is disposed between the first and second metal interconnects. The first and second metal interconnects are disposed orthogonally with respect to one another in the first region and the first and second metal interconnects are not contact-connected to one another by the contact point in the first region. In the second region, the first and second metal interconnects are disposed parallel to one another and at an oblique angle to directions of the first and second metal interconnects in the first region. Finally, the first and second metal interconnects are contact-connected to one another by the contact point in the second region.

The integrated semiconductor chip has at least two metal interconnects of two different metallization planes, which are disposed parallel to one another. The metal interconnects are electrically connected to one another by the electrically conductive contact point. The metal interconnects, for each direction, run orthogonally with respect to one another in a first region, in which they are not contact-connected to one another via the contact point. The metal interconnects, for each direction, run parallel to one another and at an oblique angle to the directions of the metal interconnects of the first region in a second region, in which they are contact-connected to one another via the contact point. Therefore, on account of the oblique-angled configuration, right-angled changes in direction that promote the influence of electromigration are not necessary for the purpose of contact connection. A configuration of this type additionally obviates the need, mentioned in the introduction, for stepwise approximation, thereby enabling a space-saving configuration of the metal interconnects.

In order to keep the influence of the electromigration as uniformly low as possible for all the metal interconnects, it is advantageous to disposed the metal interconnects, for each direction, at an angle of 45° to the directions of the metal interconnects of the first region.

In a customary embodiment, the contact point has a rectangular area parallel to the metallization planes. If the intention is for the layout of the contact point not to be changed with regard to previous contact-connection concepts, then the area of the contact point is disposed edge parallel to the metal interconnects of the first region. This may, however, require the metal interconnects to be widened in the contact-connection region, since the edges of the contact area and the metal interconnects are disposed at an oblique angle to one another and the contact point thereby occupies a larger width on the metal interconnects.

In order not to influence the width of the metal interconnects it is advantageous to dispose the area of the contact point edge parallel to the metal interconnects of the second region. Therefore, a portion of the edges of the contact area and the edges of the metal interconnects run parallel to one another in the contact-connection region.

In order to improve the contact connection, it is favorable for the metal interconnects to be connected to one another in the contact-connection region via a plurality of contact points disposed along the metal interconnects. With the configuration of the contact point in accordance with the invention, the requisite space requirement is not significantly increased as a result.

The invention can generally be applied to all semiconductor chips which have contact connection of metal interconnects of two metallization planes. With the progress in data processing and data storage and with the further development of the technical processes required for fabrication, it is becoming increasingly possible for structures of an integrated circuit which are not matched to a predetermined orthogonal layout grid to be produced faster and with increasing precision.

Other features which are considered as characteristic for the invention are set forth in the appended claims.

Although the invention is illustrated and described herein as embodied in a contact connection of metal interconnects of an integrated semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the aaccompanying drawings.

DESCRIPTION OF THE PREFERRED EMBODIMENTS

Figure 1:
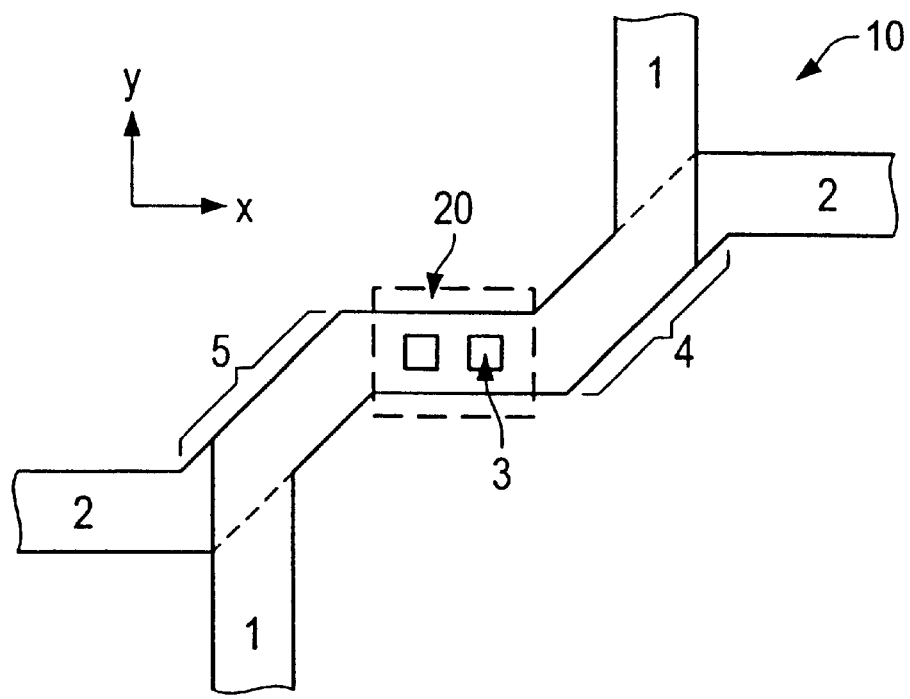
FIG. 1 is a diagrammatic, fragmented, plan view of a contact connection of two mutually orthogonal metal interconnects according to the invention.

In all the figures of the drawing, sub-features and integral parts that correspond to one another bear the same reference symbol in each case. Referring now to the figures of the drawing in detail and first, particularly, to FIGS. 1 and 4 thereof, there is shown a metal interconnect 1 of a first metallization plane 11 and a metal interconnect 2 of a second metallization plane 12. The metallization planes 11, 12 run parallel to one another (see FIG. 4), this not being discernible in the plan view according to FIG. 1. The metal interconnects 1 and 2, which are embodied in strip form, are not contact-connected to one another via a contact point 3 in a first region 10. They run orthogonally with respect to one another in accordance with a right-angled coordinate system in the Y- and X-direction, respectively. The metal interconnects 1 and 2 are electrically contact-connected to one another via the contact points 3 in a second region 20. The second region 20 and the contact points 3 are likewise aligned in accordance with the right-angled coordinate system. In order to avoid right-angled changes in direction and the associated influence of electromigration, the metal interconnects 1 and 2 have diagonal sections 4 and 5. Depending on the embodiment, such a step-like approximation of the metal interconnects 1 and 2 to the contact-connection region 20 requires a relatively high space requirement, above all in the X-direction but also in the Y-direction.

Figure 2:
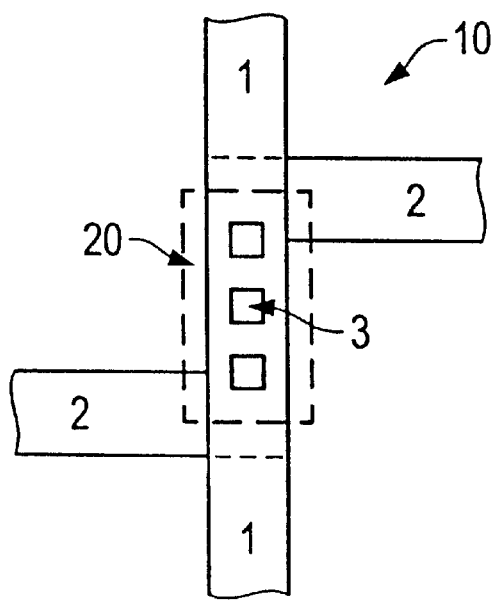
FIG. 2 is a fragmented, plan view of an alternative contact connection of the two metal interconnects.

FIG. 2 shows a second embodiment of the contact connection of the metal interconnects 1 and 2 with respect to FIG. 1. In this example, there is no need for an additional space requirement for the contact-connection region 20 in the X-direction. However, the influence of electromigration increases, in particular at edge regions of the contact-connection region 20. This is caused by the comparatively high current densities at the locations of the metal interconnect 2 at which the latter changes its course in a right-angled direction. The high current densities can lead to alterations of the material properties of the metal, as a result of which, for example, the reliability and the service life of the metal interconnect 2 may be adversely affected.

Figure 3:
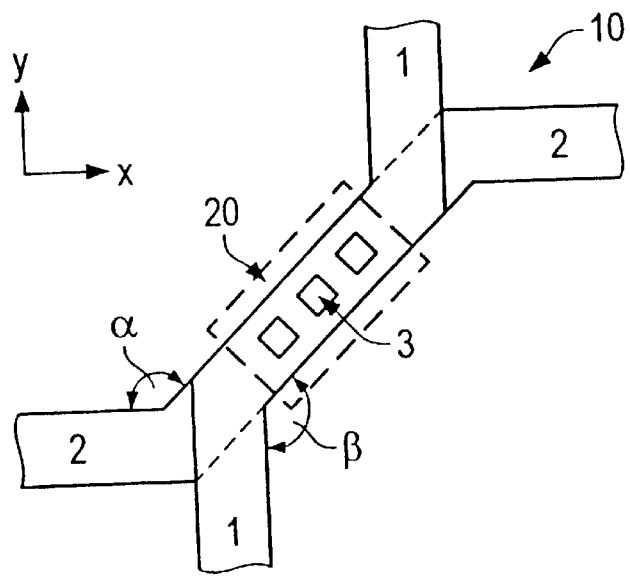
FIG. 3 is a fragmented, plan view of an embodiment for the contact connection of two mutually orthogonal metal interconnects.

FIG. 3 shows a schematic illustration of a third embodiment according to the invention for the contact connection of the metal interconnects 1 and 2. The latter, for each direction, are disposed parallel to one another and at an oblique angle to the directions of the metal interconnects 1 and 2 of the region 10 in the contact-connection region 20, in which they are contact-connected to one another via the contact points 3. Compared with the configuration according to FIG. 1, the additional space requirement for contact connection is considerably reduced, principally in the X-direction. Moreover, by avoiding right-angled changes in direction of the metal interconnects 1, 2, the influence of electromigration is reduced. In order to keep this influence uniformly small for both metal interconnects 1 and 2, a configuration of the contact-connection region 20 at an angle $\alpha=\beta$ of 45° to the directions of the metal interconnects 1 and 2 of the region 10 is advantageous.

Figure 4:
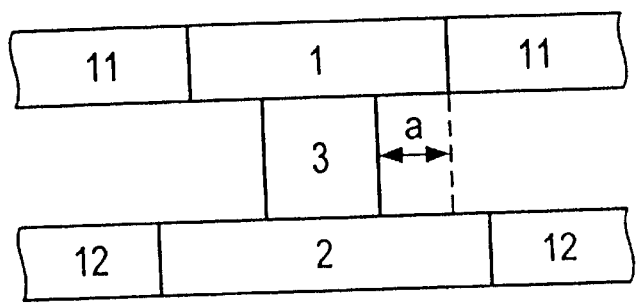
FIG. 4 is a cross-sectional view through a contact point.

FIG. 4 illustrates a schematic cross section through the contact point 3 in the contact-connection region 20. The metal interconnect 1 of the first metallization plane 11 and the metal interconnect 2 of the second metallization plane 12 can be seen. The metallization planes 11 and 12 are disposed parallel to one another. The electrically conductive contact point 3 having a rectangular area parallel to the metallization planes 11 and 12 is disposed between the metal interconnects 1 and 2. In order, for example, to be able to compensate to a certain extent for any offset—occurring during production—in the centering or line routing of the contact point 3, an overlap a is usually provided between the outermost boundary of the contact point 3 and the metal interconnect 1, for example.

Figures 5A, 5B:
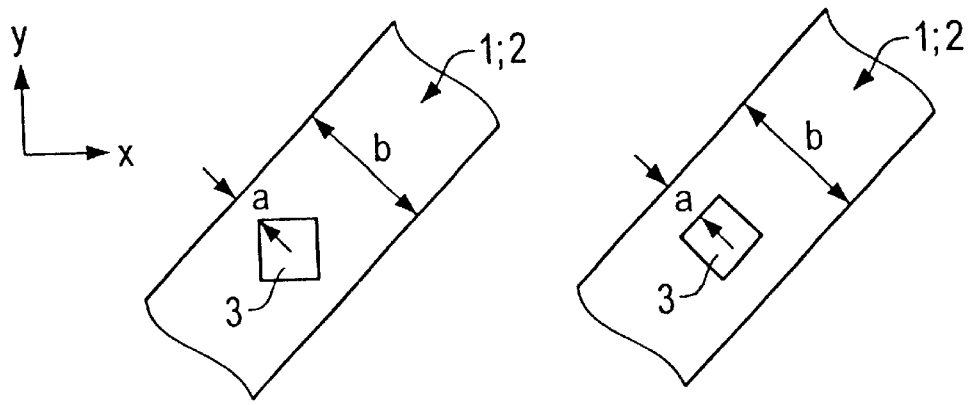
FIGS. 5a and 5b are fragmented, plan views of two alternative configurations of the contact point with respect to one another.

FIGS. 5a and 5b shows two alternative configurations of the contact point 3 with respect to one another. The mutually parallel metal interconnects 1 and 2 are illustrated partially. In FIG. 5a, the area of the contact point 3 is disposed edge parallel to the metal interconnects of the region 10. The overlap a is dimensioned from the outermost limit of the contact point 3 in the direction of the interconnect boundary (shortest distance between the contact point 3 and the edge of the interconnect). This yields the required width b of the metal interconnects 1, 2 in the contact-connection region. In FIG. 5b, the area of the contact point 3 is disposed edge parallel to the metal interconnects 1 and 2 of the contact-connection region 20. The required width b of the metal interconnects 1 and 2 is reduced, given the same overlap a, in this configuration, in comparison with the adjacent configuration in FIG. 5a. The metal interconnects 1 and 2 accordingly have a reduced space requirement in the contact-connection region, which is advantageous principally in the case of a plurality of metal interconnects 1, 2 running next to one another. The interconnects 1, 2 can thus be placed closer together.

We claim:

1. An integrated semiconductor chip, comprising metal interconnects having a first region and a second region and, including, at least one first metal interconnect of a first metallization plane and a second metal interconnect of a second metallization plane running parallel to said first metallization plane;

said first and second regions of said first and second metal interconnects each having edges, said edges of said first regions of said first and second metal interconnects being disposed orthogonally with respect to one another, and said edges of said second regions of said first and second metal interconnects being disposed parallel to one another; said edges of said first and second regions of said first metal interconnect being disposed at an oblique angle to one another and said edges of said first and second regions of said second metal interconnect being disposed at an oblique angle to one another; and at least one electrically conductive contact point disposed between said first and second metal interconnects, and said first and second metal interconnects not being contact-connected to one another by said contact point in said first region, and said first and second metal interconnects being contact-connected to one another by said contact point in said second region.

2. The integrated semiconductor chip according to claim 1, wherein in said second region said first and second metal interconnects are disposed at an angle of 45° to a direction of said first and second metal interconnects in said first region.

3. The integrated semiconductor chip according to claim 1, wherein said contact point has a rectangular area disposed parallel to said first and second metallization planes.

4. The integrated semiconductor chip according to claim 3, wherein said area of said contact point is disposed edge parallel to said metal interconnects of said first region.

5. The integrated semiconductor chip according to claim 3, wherein said area of said contact point is disposed edge parallel to said metal interconnects of said second region.

6. The integrated semiconductor chip according to claim 1, wherein said contact point is one of a plurality of contact points, and said metal interconnects are contact-connected to one another in said second region by said plurality of contact points disposed along said metal interconnects.

\* \* \* \* \*